(12) United States Patent
Leigh et al.

(10) Patent No.: US 8,572,528 B1
(45) Date of Patent: Oct. 29, 2013

(54) METHOD AND APPARATUS FOR ANALYZING A DESIGN OF AN INTEGRATED CIRCUIT USING FAULT COSTS

(75) Inventors: William E. Leigh, Del Mar, CA (US); Kenneth R. Weidele, San Diego, CA (US)

(73) Assignee: Xilinx, Inc., San Jose, CA (US)

( * ) Notice: Subject to any disclaimer, the term of this patent is extended or adjusted under 35 U.S.C. 154(b) by 578 days.

(21) Appl. No.: 12/626,559

(22) Filed: Nov. 25, 2009

(51) Int. Cl.
*G06F 17/50* (2006.01)
*G06F 9/455* (2006.01)
*G06F 11/22* (2006.01)

(52) U.S. Cl.
USPC ........... 716/106; 716/111; 716/116; 716/117; 716/118; 716/136

(58) Field of Classification Search
None
See application file for complete search history.

(56) References Cited

U.S. PATENT DOCUMENTS

| | | | |
|---|---|---|---|
| 5,157,668 A * | 10/1992 | Buenzli et al. | 714/26 |
| 6,086,626 A * | 7/2000 | Jain et al. | 716/103 |
| 6,301,687 B1 * | 10/2001 | Jain et al. | 716/107 |
| 6,701,474 B2 * | 3/2004 | Cooke et al. | 714/724 |
| 6,957,413 B1 * | 10/2005 | McKeone et al. | 716/103 |
| 7,139,955 B2 * | 11/2006 | Rohrbaugh et al. | 714/738 |
| 7,206,287 B2 * | 4/2007 | Chuah et al. | 370/241 |
| 7,227,364 B1 * | 6/2007 | Fan et al. | 324/528 |
| 7,246,285 B1 * | 7/2007 | Eldin et al. | 714/725 |
| 7,408,381 B1 | 8/2008 | Drimer et al. | |
| 7,729,884 B2 * | 6/2010 | Huang et al. | 702/185 |
| 7,870,519 B2 * | 1/2011 | Desineni et al. | 716/136 |
| 7,949,974 B1 * | 5/2011 | Moore et al. | 716/111 |
| 2002/0091979 A1 * | 7/2002 | Cooke et al. | 714/733 |
| 2009/0132976 A1 * | 5/2009 | Desineni et al. | 716/5 |
| 2011/0055777 A1 * | 3/2011 | Tremaine et al. | 716/106 |

OTHER PUBLICATIONS

P. Kenterlis et al., A Low-Cost SEU Fault Emulation Platform for SRAM-Based FPGAs, Proceedings of the 12th IEEE International On-Line Testing Symposium, pp. 235-241, Sep. 2006.*

* cited by examiner

*Primary Examiner* — A. M. Thompson
(74) *Attorney, Agent, or Firm* — Kin-Wah Tong

(57) ABSTRACT

In one embodiment, a method and apparatus for analyzing a design of an integrated circuit (IC) are disclosed. For example, the method parses a netlist file of the IC where a module of the IC is parsed into a plurality of sub-modules in accordance with a hierarchical structure. The method traces through a connectivity of the plurality of sub-modules, and tabulates data associated with the connectivity with a fault cost associated with a structure of the IC.

20 Claims, 4 Drawing Sheets

```
module mod_name ( signal_0[7:0], signal_1[7:0], signal_2[3:0],
                  signal_3[3:0], port_a, port_b );

input port_a, port_b;
  inout [7:0] signal_0;
  inout [7:0] signal_1;               210
  output [3:0] signal_2;
  output [3:0] signal_3;

instance_type1 Instance_Name1(port_a, signal_0[7:0], signal_2[3:0]);
  instance_type2 Instance_Name2(port_b, signal_1[7:0], signal_3[3:0], port_a);
  instance_type3 Instance_Name3(port_b, port_a, signal_0[7:0], signal_3[3:0]);
endmodule
```

FIG. 2

FIG. 3 module_struct name = "mod_name";
slist_len    = 26;
iolist_len   = 26;
submod_len = 3;
slist[24] = slist[25] = slist[24] (slist_struct)
name = "port_a"
type = "input";
NFan = 3;

smap_struct smap[0]=
INST = "Instance_Name1";
MOD = "instance_type1;
NPos = 0;
0; // no IO_Mismatch;
submodPtr->"Instance_Name1";

smap[1]=
INST = "Instance_Name2";
MOD = "instance_type2;
NPos = 13;
0; // no IO_Mismatch;
submodPtr->"Instance_Name2";

smap[2]=
INST = "Instance_Name3";
MOD = "instance_type3;
NPos = 1;
0; // no IO_Mismatch;
submodPtr->"Instance_Name3";

slist[25] (slist_struct)
name = "port_b"
type = "input";
NFan = 2;

smap_struct smap[0]=
INST = "Instance_Name2";
MOD = "instance_type2;
NPos = 0;
0; // no IO_Mismatch;
submodPtr->"Instance_Name2";

smap[1]=
INST = "Instance_Name3";
MOD = "instance_type3;
NPos = 0;
0; // no IO_Mismatch;
submodPtr->"Instance_Name3";

US 8,572,528 B1

METHOD AND APPARATUS FOR ANALYZING A DESIGN OF AN INTEGRATED CIRCUIT USING FAULT COSTS

RESERVATION OF RIGHTS IN COPYRIGHTED MATERIAL

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

FIELD OF THE INVENTION

This invention relates generally to a method and apparatus for analyzing a design or architecture of an integrated circuit (IC), e.g., a programmable logic device (PLD).

BACKGROUND OF THE INVENTION

Analysis of the designs of integrated circuits can be performed to quantify fault isolation. However, such analysis is often time consuming and labor intensive. Furthermore, such analysis is often only performed to discover potential flaws in the IC designs. As a result, such analysis is not well suited to address issues such as determining a fault cost for a structure of the IC, e.g., a fault cost for a particular type of multiplexer in the IC. For example, a fault cost can be defined broadly as a number of functional faults that need to occur before a structure in the IC will fail. Using a multiplexer as an example, a fault cost may indicate a number of transistors that will need to fail before an input of the multiplexer is leaked unintentionally to the output of the multiplexer.

SUMMARY OF THE INVENTION

In one embodiment, a method for analyzing a design of an integrated circuit (IC) is disclosed. For example, the method parses a netlist file of the IC where a module of the IC is parsed into a plurality of sub-modules in accordance with a hierarchical structure. The method traces through a connectivity of the plurality of sub-modules, and tabulates data associated with the connectivity with a fault cost associated with a structure of the IC.

In another embodiment, a computer-readable storage medium having instructions stored thereon is disclosed. The instructions include instructions which, when executed by a processor, cause the processor to perform steps of a method for analyzing a design of an integrated circuit (IC) that includes: (1) parsing a netlist file of the IC where a module of the IC is parsed into sub-modules in accordance with a hierarchical structure; (2) tracing through a connectivity of the sub-modules; and (3) tabulating data associated with the connectivity with a fault cost associated with a structure of the IC.

In yet another embodiment, an apparatus for analyzing a design of an integrated circuit (IC) includes a processor that is configured to: (1) parse a netlist file of the IC where a module of the IC is parsed into sub-modules in accordance with a hierarchical structure; (2) trace through a connectivity of the sub-modules; and (3) tabulate data associated with the connectivity with a fault cost associated with a structure of the IC.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

FIG. 2 illustrates one example of determining the connectivity of a sensitivity list element according to an embodiment of the present invention;

FIG. 3 illustrates nested structures containing sensitivity list connectivity according to an embodiment of the present invention;

DETAILED DESCRIPTION OF THE DRAWINGS

Figure 1:
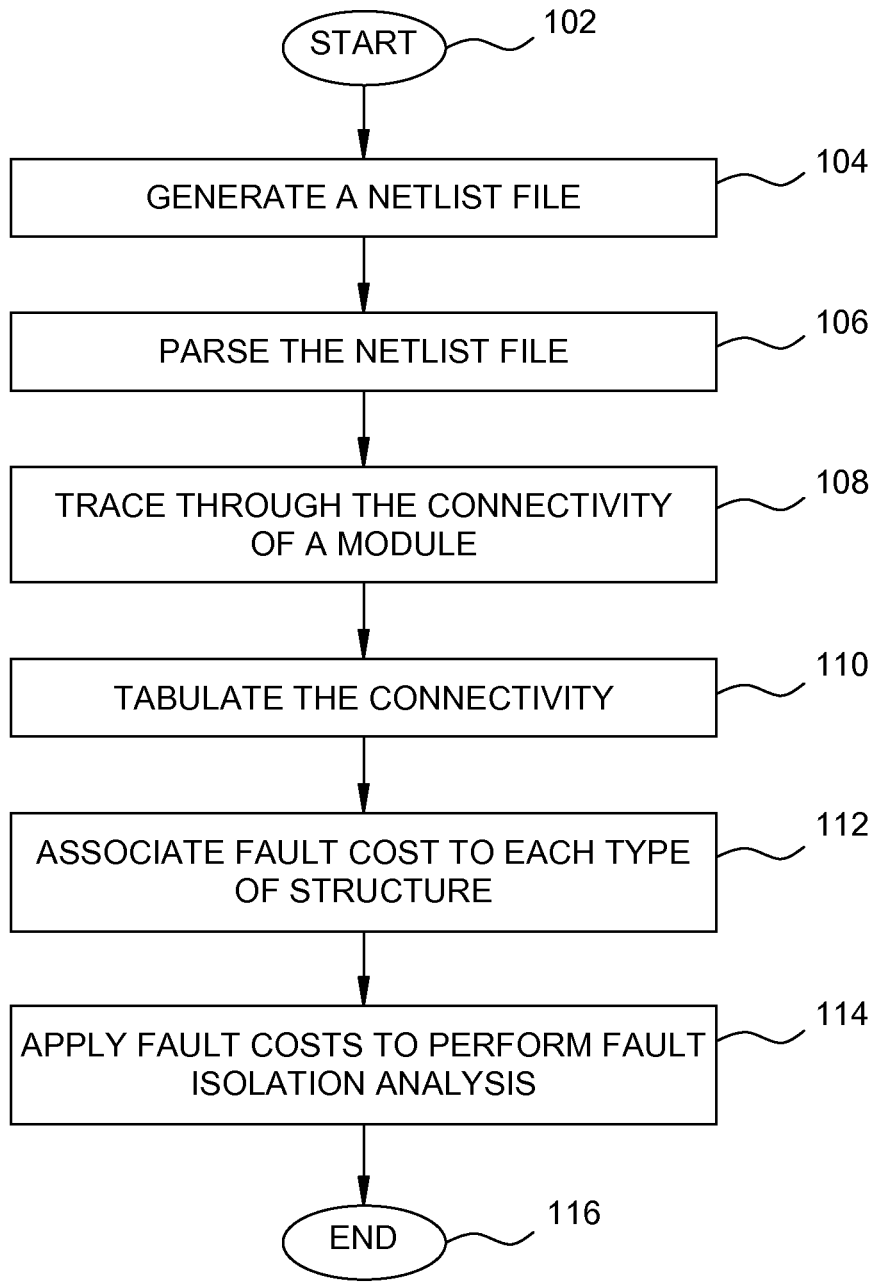
FIG. 1 illustrates a block diagram of a method for performing a fault cost analysis on an IC architecture or IC design according to an embodiment of the present invention.

In one embodiment, the present invention relates generally to a method and apparatus for analyzing a design or architecture of an integrated circuit (IC), e.g., a programmable logic device (PLD). For example, the present invention can be implemented as a software tool that is deployed in a tester, e.g., a general purpose computer loaded with the software tool.

In one embodiment, the IC that can be analyzed with the present invention is a programmable logic device. Although the present invention is disclosed in the context of a PLD, it should be noted that one or more aspects of the present invention relate generally to an integrated circuit (IC) and is not limited to a PLD. Namely, the designs or architectures of any type of ICs can be analyzed by the present invention.

More specifically, in one embodiment, one or more aspects of the present invention relate generally to a programmable logic device. A programmable logic device (PLD) is a general-purpose device that can be programmed by a user to implement a variety of selected functions. One type of PLD is a Field Programmable Gate Array (FPGA), which typically includes an array of configurable logic blocks (CLBs) and a plurality of input/output blocks (IOBs). The CLBs are individually programmable and can be configured to perform a variety of logic functions on a few input signals. The IOBs can be configured to drive output signals from the CLBs to external pins of the FPGA and/or to receive input signals from the external FPGA pins. The FPGA also includes a programmable interconnect structure that can be programmed to selectively route signals among the various CLBs and IOBs to produce more complex functions of many input signals. The CLBs, IOBs, and the programmable interconnect structure are programmed by loading configuration data into associated memory cells that control various switches and multiplexers within the CLBs, IOBs, and the interconnect structure to implement logic and routing functions specified by the configuration data to implement a user design in the FPGA. An FPGA may also include other programmable and non-programmable resources.

In one embodiment, the present invention is used to aid in the fault isolation analysis of a FPGA. In brief, the method illustratively operates on the netlist file, e.g., a Verilog netlist file or a VHDL netlist file, of an FPGA's CLB architecture and performs a trace on each CLB I/O net. It should be noted that the present invention is not limited to any particular netlist file format. As such, the above disclosure pertaining to the Verilog or VHDL formats are only illustrative.

Furthermore, the present invention discusses the study of a module as pertaining to a CLB. However, the present invention is not limited to the CLB modules. To illustrate, the mechanism of the CLB which embodies the various multiplexer types is referred to as the Global Switch Matrix (GSM). There are other modules (e.g., Block RAM, DSP48, IOB, and so on), similar to the CLB which make up a PLD/FPGA. Some of these also utilize the GSM mechanism and thus, fall under the same use case as that of the CLB. Thus, the present fault cost extraction method is not limited to only CLB modules.

In one embodiment, the method traces the CLB net's connections down through successive module layers of the CLB design, and stops at the lowest level, e.g., at the multiplexer (mux) structures that make up the CLB, or even to a lower level, e.g., at the transistor level. The method then stores and tabulates the entire set of multiplexers to which each CLB I/O net connects. Connections made to this net can then be assigned a fault isolation cost, which is found by inspecting the fault cost of the multiplexer which makes the design connection. In this manner, the present method automates the process of exploring the FPGA low level design, and the process of assigning fault costs to connections between the CLB I/O nets.

In one embodiment, the present invention operates on a netlist file that is a text-based netlist file. Since the present invention operates on text-based netlist files, the present invention can be used to analyze FPGA architectures across numerous FPGA families without modification.

FIG. 1 illustrates a block diagram of a method 100 for performing a fault cost analysis on an IC architecture or an IC design according to an embodiment of the present invention. For example, method 100 can be performed by a tester, a simulator or a general purpose computer or server. The method starts in step 102 and proceeds to step 104.

In step 104, the method generates a netlist file, e.g., a Verilog netlist file, of an architecture of an IC, e.g., an FPGA, to be analyzed. Broadly defined, a netlist describes the connectivity of an electronic design. Netlists usually convey connectivity information and provide instances, nets, and/or various attributes. Netlists may contain or refer to descriptions of the structures or devices used. Each time that a part or structure is used in a netlist, it is referred to as an "instance." Thus, each instance has a "definition" that will usually list the connections that can be made to that kind of device, and some basic properties of that device. These connection points are called "ports" or "pins", among several other names. It should be noted that an "instance" may comprise a MOSFET transistor, a bipolar transistor, a resistor, a capacitor, an IC chip and the like. Broadly, nets are the "wires" that connect structures in the circuit.

Various software tools exist in generating a netlist file. For example, to create a Verilog netlist from a schematic, the schematic can be processed via a schematic viewer tool like Cadence OPUS available from Cadence Design Systems, Inc. of San Jose, Calif. It should be noted that the present invention is not limited by any particular software tool that is used to generate the netlist file or the netlist file format.

In one embodiment, the resulting netlist file can be optionally hand-edited to exclude certain modules that may not be of interest before the automated analysis discussed further below is applied to the netlist file. For example, the modules or blocks that are not of interest in the resulting netlist file can be commented out by adding two forward slashes, "//", to the beginning of the lines contained within these blocks.

In step 106, the method parses or classifies the netlist file. Broadly, in step 106, the method will parse through the netlist file of the IC architecture and will organize each module into a plurality of sub-modules in accordance with a hierarchical structure. For example, for each module, the present method will determine: a module name, a sensitivity list and the type of each signal, and any sub-modules and their associated sensitivity lists and so on. In one embodiment, the present method first determines the complete connectivity of the CLB I/O nets by parsing through the netlist file and extracting the "modules" declared in the netlist file. Broadly defined, a module comprises an electronic entity or structure that handles electrical inputs and outputs; e.g., at a highest level, the entire IC can be perceived as a module, or at a lower level, each CLB can be perceived as a module. However, the term "module" (or "sub-module") may encompass any collection of structures that comprise a subset of the structures within the IC.

For example, Verilog modules can be defined from the bottom-most level to the top-most level in the following format:

module module_type (sens_list$_0$, sens_list$_1$, ..., sens_list$_{n-1}$)
    signal_direction_specifier sens_list$_0$;
    signal_direction_specifier sens_list$_1$;
    signal_direction_specifier sens_list$_{n-1}$;
    submodule_type submodule_name$_0$(sens_list$_{00}$, sens_list$_{01}$, ..., sens_list$0_{p-1}$);
    submodule_type submodule_name$_1$(sens_list$_{10}$, sens_list$_{11}$, ..., sens_list$0_{q-1}$);
    submodule_type submodule_name$_{m-1}$(sens_list$_{m-10}$, sens_list$_{m-11}$, ..., sens_list$_{m-1r-1}$);
endmodule In the above example, the "module_type" refers to a name or type of a module followed by a sensitivity list comprising a plurality of elements that are shown in parenthesis, e.g., (sens_list0, sens_list1, ..., sens_listn−1) are elements of the sensitivity list for the module. Broadly defined, the sensitivity list comprises a listing of inputs and/or outputs to a module or sub-module. For example, each element of the sensitivity list may comprise a signal that is provided to or received from a module or sub-module. In the above example, the "signal_direction_specifier" refers to a direction of an element of the sensitivity list (e.g., input, output, input and output (inout), or a wire signal), whereas "submodule_type" refers to a sub-module that forms a part of the module, where the sub-module itself also has its own sensitivity list, and so on. It should be noted that the above example illustrates that the elements of the sensitivity list will map to the elements of the sensitivity lists of the three sub-modules as discussed further below with respect to FIG. 2.

In one embodiment, the present invention parses the module information and organizes it into a plurality of sub-modules, e.g., into a C-language or C++ language module structure. It should be noted that the present invention is not limited to a particular language module structure or format. For example, the parsed information can be organized as follows:

```
typedef struct module_struct
{
int        slist_len;        // length of input
                             sensitivity list
```

```
int;         iolist_len;              // length of io
                                      list
int          submod_len;              // number of sub
                                      modules
char         name[MAXNAME];           // name of module
                                      type
slist_t      slist[MAXARG];           // array of structures
                                      for sens list
iolist_t     iolist[MAXARG];          // array of structures
                                      for io list
submod_t     submod[MAXSUBMO];        // array of structures
                                      for submodules
} module_t
where:
slist_len    = n;
iolist_len   = n;
submod_len   = m;
name         = "module_type"
slist:       contains n slist_t structures,
             1 for each sensitivity list element
iolist:      contains n iolist_t structures,
             1 for each io list element
submode      contains m submod_t structures,
             1 for each instantiated submodule.
```

In step 108, the method will trace through the connectivity of the module. For example, tracing through the connectivity comprises starting at the top-most module level (in this case the single CLB module level) and operating on each element of its sensitivity list. More specifically, for each sensitivity list element, a signal_direction_specifier is matched up by matching the element name to the names in the list of signal direction specifiers. The signal_direction_specifier specifies if the net is an input, output, inout or wire signal.

It should be noted that the sub-modules are instantiated from within the modules by first specifying the submodule_type followed by the name of the sub-module instantiation. Each sub-module instantiation contains its own sensitivity list which links this module to the next lower module layer and so on.

In one embodiment, the connectivity of this module's nets to those of the sub-modules is accomplished by matching the module's net names to those of the sub-module sensitivity lists. It should be noted that any module's nets can map to the sensitivity lists of more than one sub-module instantiation.

In one illustrative embodiment, for each net, a C-language structure is setup that contains the net's name, directional specifier, number of sub-modules to which it connects, and an array of pointers to those sub-modules. Structures that represent these sub-modules contain the sensitivity list position in the parent net, the name and type of the sub-module, whether an I/O mismatch exists, and a pointer to the sub-module's main "module" structure.

FIG. 2 illustrates one example of the present method in determining the connectivity of the sensitivity list element "port_a". In this illustrative example, the sensitivity list element "port_a" is shown in the sensitivity list for the module named "mod_name". The sensitivity list element "port_a" is also shown as an input signal, i.e., providing information as to the direction of the "port_a" signal. This sensitivity list element "port_a" at the module level is then mapped or traced to the sensitivity list of the sub-modules.

At the end of tracing through this module, the present method will have created structures linking the single net element "port_a" to three (3) instantiated sub-modules. FIG. 3 shows illustrative nested structures that are created to store these connectivities. It should be noted that the present invention is not limited to the specific format of these nested structures.

Referring to FIG. 3, it should be noted that the module sensitivity list is separated from the arrays down to the individual sensitivity elements. In other words, as an example, the present method separates the sensitivity list element signal_0[7:0] into 8 elements: signal_0[7], signal_0[6], signal_0[5], signal_0[4], signal_0[3], signal_0[2], signal_0[1], signal_0[0], because the sub-modules may be connected by the entire array of signal_0[7:0], or by individual elements of the array signal_0[7:0].

In one embodiment, the module data is first parsed and organized into the "module_struct" structure shown in FIG. 3. Then each sensitivity list element is parsed and organized into the "slist_struct" structure. Finally, the mapping of each sensitivity list element to sub-module is parsed and organized into "smap_struct" structures.

In one embodiment, the connectivity between the input net and sub-module sensitivity list is established in these smap_structs. Thus, the smap_struct contains the instance name, the instance type, the sensitivity list position of the parent net in the sub-module sensitivity list position, and a pointer to the instantiated sub-module.

This connectivity is traced downwards until no more sub-modules are instantiated. As the present method finishes the tracing of the "port_a" net as shown in FIG. 2, an overall connectivity map can be constructed as illustrated in FIG. 4.

Figure 4:
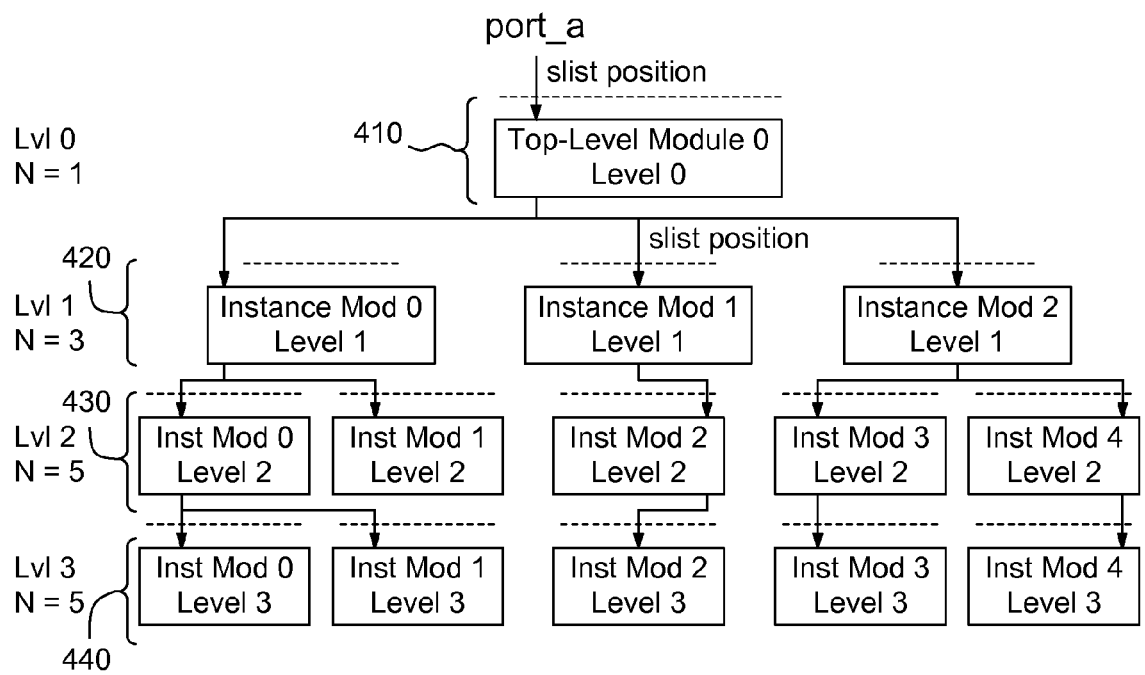
FIG. 4 illustrates an overall connectivity map for a sensitivity element according to an embodiment of the present invention.

Broadly, FIG. 4 shows a hierarchical structure or tree of modules and sub-modules in a plurality of levels (410-440). For example, the highest level (Lvl 0) 410 has one module (N=1) and the lowest level (Lvl 3) 440 has five (5) sub-modules (N=5).

It should be noted that in this example the top-level net is called "port_a", and within the module shown, "port_a" is found to connect to the sub-modules by matching the net name. This determines the position of the port_a connection in the sensitivity list of the sub-module. However, from the perspective of the sub-module, the name of the input net at that sensitivity list position does not have to be the same net name. Thus, the name of the net traced down to its lowest module structure may be significantly different from the name of the net at the top-level module or CLB input.

It should be noted that the present method keeps track of the total number of sub-modules instantiated at each trace level. This total sub-module count is used to sequence the tracing to generate sub-modules located in the next deepest trace level. As the present method sequences through each sub-module at level L, it determines connectivity, and builds up the list of sub-modules at level L+I. This allows an embodiment of the present invention to avoid having to retrace its steps up the tree structure, i.e., having to remember where it left a branch in the tree structure or to recontinue downwards again, thereby allowing each trace level to be generated in order.

It should be noted that since trace routes may terminate at different trace levels, this requires the present method to chain back through the final trace structure to locate end trace nodes and to note the path sequence. This information is also saved for tabulation. As it does so, it marks these end nodes and the intervening path as complete.

Figure 5:
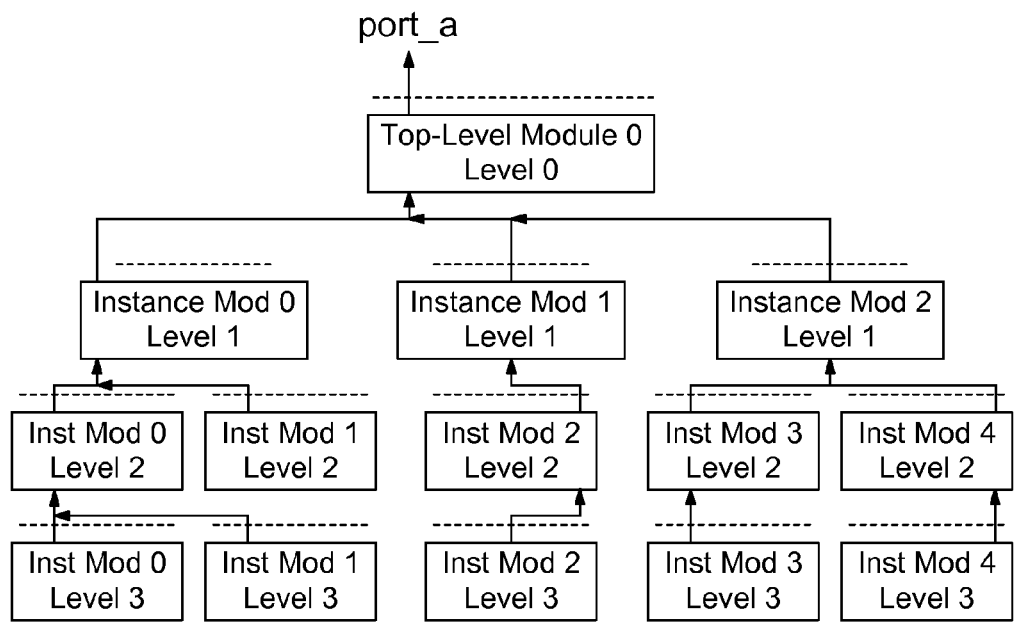
FIG. 5 illustrates the tracing of the paths upward from all of the end modules according to an embodiment of the present invention.

Referring back to FIG. 1, in step 110, the present method tabulates the connectivity information (broadly referred to as data associated with the connectivity). For example, FIG. 5 illustrates the present method tracing the paths upward from all of the end modules, thereby tabulating connectivity for each top-level net.

In one embodiment, the present method performs the tracing for each CLB I/O net, and traces down to the lowest structural level. For example, the present method may trace down to the transistor level. In turn, this will provide useful fault isolation information to higher levels, e.g., at the multiplexer level, which may comprise various multiplexer types, e.g., multiplexer types that are based on wire length and so on. It should be noted that the present invention is not limited by the number of multiplexer types.

In one embodiment, each CLB I/O net is provided in a format that is easily imported into another program, e.g., into a spreadsheet. Since each net may have multiple endpoints, the end structures for each net are sorted alphabetically, enumerated if there is a multiplicity of the same endpoint type, and any I/O type mismatchs are noted if they are detected. For example, a mismatch is a condition where a higher level signal_direction_specifier specifies a direction of a signal that is in conflict with a lower level. It should be noted that the use of a spreadsheet is only illustrative. In other words, an embodiment of the present invention can be implemented in a single software tool without the need for additional external software.

In one embodiment, fault costs are then associated with each type of endpoint structure and these are attached to the CLB net. The entire trace path can be stored and then provided as an output to a user or to another analysis tool or device for further processing. A portion of an illustrative trace is shown in Table 1 below.

TABLE 1

| Sig Lvl 0 | Direction | Mux Type | number of structures | Slist Len | Sig Lvl Last | Direction | Fault Cost |
|---|---|---|---|---|---|---|---|
| el2beg[2] | output | type 1 | 3 | 16 | out | output | 8 |
|  | output | type 2 | 24 | 21 | in [10] | input | 5 |
|  | output | type 3 | 3 | 12 | in [15] | input | 5 |
|  | output | type 3 | 3 | 12 | in [16] | input | 5 |
|  | output | type 4 | 6 | 16 | in [18] | input | 5 |

Table 1 illustrates the tabulated data for a particular sensitivity element (e.g., a signal) as shown in Column 1 with respect to various fault costs associated with various types of structures, e.g., multiplexer types in this example. For example, Table 1 illustrates that the sensitivity element is connected to three "type 1" mux structures, twenty-four "type 2" mux structures, six "type 3" mux structures and six "type 4" mux structures (e.g., Column 3 of Table 1 provides the mux type and Column 4 of Table 1 provides the number of that particular type of structure). Furthermore, Column 6 of Table 1 provides the name of the end signal. Thus, Table 1 illustrates that there are 24 instances of merging of paths, e.g., where the "type 2" mux structures end at the signal "[10]". Thus, multiple instances of the merging are tabulated into Table 1. Table 1 also provides the direction of the signal, e.g., Column 7 indicates the signal direction as being either output or input in this example. Furthermore, Column 6 of Table 1 illustrates that the signal is exiting the "type 1" mux structure as an output, but it is also provided as an input with respect to the "type 2" mux structure, the "type 3" mux structure and the "type 4" mux structure. It should be noted that Column 2 of Table 1 illustrates that the signal itself at the highest level (e.g., at the IC level) is indicated as an output signal. Column 5 provides the length of the input sensitivity list. Thus, the information stored and tabulated in Table 1 provides a significant amount of useful information that is associated with the signal.

Returning to FIG. 1, in step 112 the method associates a fault cost to each type of structure, e.g., an endpoint structure. It should be noted that although step 112 is illustrated as a distinct step from that of step 110, it can in fact be alternatively embodied within step 110. To illustrate, Column 8 of Table 1 provides a fault cost associated with each structure type. For example, a fault cost can be defined broadly as a number of functional faults that need to occur before a structure in the IC will fail and breech input to output or vice versa. As such, eight (8) transistors must fail for the "type 1" mux before the input of the "type 1" mux is unintentionally leaked or connected (e.g., an unintentional short) to the output of the "type 1" mux.

Returning to FIG. 1, in step 114 the method applies the tabulated fault costs to perform a fault isolation analysis. For example, the data stored in Table 1 can now be used to determine what is the fault cost for the signal "el2beg[2]". In other words, it is now possible to provide an accurate assessment or to quantify as to how a potential failure will impact the leakage of signals from an IC. This ability allows a designer to amend his or her IC design or architecture to address a particular performance requirement and/or security requirement.

To illustrate, if a particular signal is important for an IC and a designer is interested in ensuring that this particular signal will not be unintentionally leaked due to a failure, then the designer can change his or her design to increase the fault cost associated with this signal. For example, the designer can change the multiplexer type at a lower level of the design.

In another example, the designer may be tasked with isolating a group of critical functions on an IC from another group of non-critical functions. If a PLD is employed, then the designer may design into the layout of the PLD a barrier or a fence (e.g., a number of blocks or cells on the PLD) to separate the critical functions from the non-critical functions. However, without the guidance of the present invention, a designer may simply arbitrarily choose the size of the barrier. In contrast, using an embodiment of the present invention, the designer will now be able to ascertain or to quantify the fault cost associated with the barrier. Thus, the designer will now be able to adjust his or her design to increase or decrease the fault cost in accordance with the security requirements specified for a particular embodiment. In sum, the present invention provides a method that generates useful information directly from a netlist file that can then be used to perform various fault isolation analyses, and the like.

Returning to FIG. 1, the method ends in step 116. It should be noted that although not specifically specified, one or more steps of method 100 may include a storing, displaying and/or outputting step as required for a particular application. In other words, any data, records, fields, tables, and/or intermediate results discussed in the method can be stored, displayed and/or outputted to another device as required for a particular application. Furthermore, steps or blocks in FIG. 1 that recite a determining operation or involve a decision, do not necessarily require that both branches of the determining operation be practiced. In other words, one of the branches of the determining operation can be deemed as an optional step.

In one embodiment, the present method parses the netlist and creates two output files: modules.txt and nets.txt. Furthermore, the modules discovered in the netlist can be optionally displayed on a monitor or display during the parsing of the netlist. In one embodiment, the modules.txt file is an ascii file that lists the modules discovered in its trace, e.g., the same modules that were displayed to the screen during the netlist processing. Nets.txt file is a tab separated ascii file that can be imported to a spreadsheet which is a convenient way to view the tabulated connectivity and analysis results.

Figure 6:
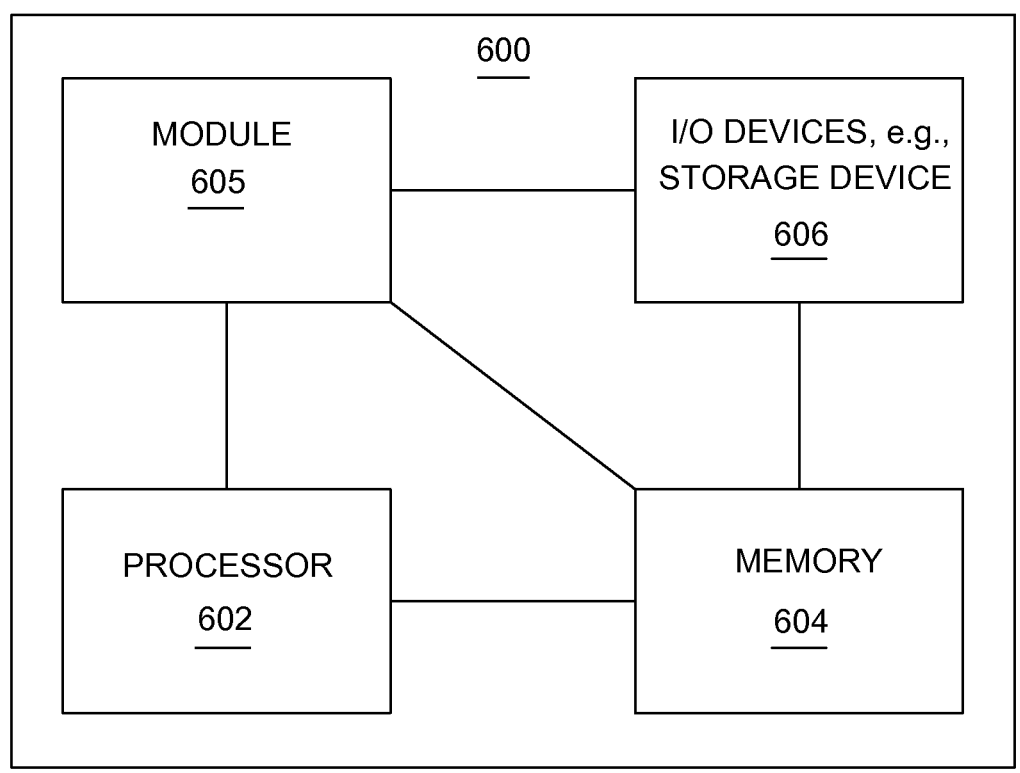
FIG. 6 illustrates a high level block diagram of a general purpose computer or a computing device suitable for use in performing the functions described herein.

FIG. 6 depicts a high level block diagram of a general purpose computer or a computing device suitable for use in performing some or all of the functions described herein. As depicted in FIG. 6, the system 600 comprises a processor element 602 (e.g., a CPU), a memory 604, e.g., a random access memory (RAM) and/or a read only memory (ROM), a module 605 for analyzing a design of an integrated circuit (IC), and various input/output devices 606 (e.g., storage devices, including but not limited to, a memory device, a tape drive, a floppy drive, a hard disk drive or a compact disk drive, a receiver, a transmitter, a speaker, a display, a speech synthesizer, an output port, and a user input device (such as a keyboard, a keypad, a mouse, and the like)).

One or more embodiments of the present invention can be implemented in software and/or in a combination of software and hardware, e.g., using application specific integrated circuits (ASIC), a general purpose computer or any other hardware equivalents such as microprocessors. In one embodiment, the present module or process for analyzing a design of an integrated circuit (IC) can be loaded into memory 604 and executed by processor 602 to implement the functions as discussed above. As such, the present module or process 605 for analyzing a design of an integrated circuit (IC) (including associated data structures) of embodiments of the present invention can be stored on a computer readable storage medium, e.g., RAM memory, magnetic or optical drive or diskette and the like.

While the foregoing describes exemplary embodiment(s) in accordance with one or more aspects of the present invention, other and further embodiment(s) in accordance with the one or more aspects of the present invention may be devised without departing from the scope thereof, which is determined by the claim(s) that follow and equivalents thereof. Claim(s) listing steps do not imply any order of the steps. Trademarks are the property of their respective owners.

What is claimed is:

1. A method for analyzing a design of an integrated circuit (IC), comprising:
   assigning a fault cost to a plurality of endpoint structures of the IC;
   parsing a netlist file of said IC where a module of said IC is parsed into a plurality of sub-modules in accordance with a hierarchical structure until the plurality of endpoint structures of the IC is reached;
   tracing through an end-to-end connectivity of said plurality of sub-modules to produce an overall connectivity map for the IC, wherein said tracing comprises mapping each input signal and output signal of the module through the plurality of sub-modules to the plurality of endpoint structures; and
   tabulating data associated with the end-to-end connectivity with the fault cost assigned to at least one of the plurality of endpoint structures of the IC.

2. The method of claim 1, further comprising:
   generating said netlist file in a text-based format.

3. The method of claim 1, wherein said parsing comprises:
   organizing said IC or a portion of said IC into said plurality of sub-modules.

4. The method of claim 3, wherein said organizing comprises:
   organizing a configurable logic block (CLB) of said IC into said plurality of sub-modules.

5. The method of claim 1, wherein said parsing comprises:
   generating a plurality of levels of said hierarchical structure in order from a highest level of said hierarchical structure to a lowest level of said hierarchical structure.

6. The method of claim 5, wherein said parsing further comprises:
   representing said IC in the highest level of said hierarchical structure.

7. The method of claim 5, wherein said parsing further comprises:
   representing one or more transistors in the lowest level of said hierarchical structure.

8. The method of claim 5, wherein said tracing comprises, at each of the plurality of levels:
   tracking a total number of the plurality of sub-modules that is instantiated at a next lower level of the plurality of levels.

9. The method of claim 1, wherein said assigning comprises:
   expressing said fault cost in terms of a number of transistors in said module that needs to fail.

10. The method of claim 1, further comprising:
    applying said fault cost in a fault isolation analysis.

11. The method of claim 1, wherein the parsing comprises:
    determining a name for the module;
    determining a list containing the each input signal and output signal of the module; and
    determining the plurality of sub-modules.

12. The method of claim 1, wherein said tracing comprises:
    matching a direction specifier to the each input signal and output signal of the module; and
    matching names of nets of the module to names of input signals and output signals of the plurality of sub-modules.

13. The method of claim 1, wherein the tracing comprises:
    marking each of the plurality of endpoint structures as an end node of a complete path through said plurality of sub-modules.

14. A computer-readable storage medium having stored thereon a plurality of instructions, the plurality of instructions including instructions which, when executed by a processor, cause the processor to perform steps of a method for analyzing a design of an integrated circuit (IC), comprising:
    assigning a fault cost to a plurality of endpoint structures of the IC;
    parsing a netlist file of said IC where a module of said IC is parsed into a plurality of sub-modules in accordance with a hierarchical structure until the plurality of endpoint structures of the IC is reached;
    tracing through an end-to-end connectivity of said plurality of sub-modules to produce an overall connectivity map for the IC, wherein said tracing comprises mapping each input signal and output signal of the module through the plurality of sub-modules to the plurality of endpoint structures; and
    tabulating data associated with the end-to-end connectivity with the fault cost assigned to at least one of the plurality of endpoint structures of the IC.

15. The computer-readable storage medium of claim 14, further comprising:
    generating said netlist file in a text-based format.

16. The computer-readable storage medium of claim 14, wherein said parsing comprises:
    organizing said IC or a portion of said IC into said plurality of sub-modules.

17. The computer-readable storage medium of claim 14, wherein said parsing comprises:
    generating a plurality of levels of said hierarchical structure in order from a highest level of said hierarchical structure to a lowest level of said hierarchical structure.

18. The computer-readable storage medium of claim 17, wherein said parsing further comprises:
    representing said IC in the highest level of said hierarchical structure; and representing one or more transistors in the lowest level of said hierarchical structure.

19. The computer-readable storage medium of claim 14, wherein said assigning comprises:
expressing said fault cost in terms of a number of transistors in said module that needs to fail.

20. An apparatus for analyzing a design of an integrated circuit (IC), comprising:
a processor executing a process that performs:
assigning a fault cost to a plurality of endpoint structures of the IC;
parsing a netlist file of said IC where a module of said IC is parsed into a plurality of sub-modules in accordance with a hierarchical structure until the plurality of endpoint structures of the IC is reached;
tracing through an end-to-end connectivity of said plurality of sub-modules to produce an overall connectivity map for the IC that maps each input signal and output signal of the module through the plurality of sub-modules to the plurality of endpoint structures; and
tabulating data associated with the end-to-end connectivity with the fault cost assigned to at least one of the plurality of endpoint structures of the IC.

* * * * *